(12) United States Patent
Kuehnel

(10) Patent No.: US 7,129,742 B1
(45) Date of Patent: Oct. 31, 2006

(54) MAJORITY LOGIC CIRCUIT

(75) Inventor: Richard John Kuehnel, Stuttgart (DE)

(73) Assignee: The United States of America as represented by the National Security Agency, Washington, DC (US)

( * ) Notice: Subject to any disclaimer, the term of this patent is extended or adjusted under 35 U.S.C. 154(b) by 152 days.

(21) Appl. No.: 11/064,130

(22) Filed: Feb. 23, 2005

(51) Int. Cl.
 *H03K 19/23* (2006.01)
(52) U.S. Cl. .......................................... 326/35; 326/38
(58) Field of Classification Search ............. 326/35–38
 See application file for complete search history.

(56) References Cited

U.S. PATENT DOCUMENTS

| | | | |
|---|---|---|---|
| 4,091,293 A | 5/1978 | Ando | |
| 4,692,640 A | 9/1987 | Suzuki et al. | |
| 4,748,594 A * | 5/1988 | Iida | ............................ 365/200 |
| 5,235,220 A * | 8/1993 | Takizawa | ...................... 326/35 |
| 5,680,408 A | 10/1997 | Tsirkel | |
| 6,320,409 B1 * | 11/2001 | Nakajima et al. | ............. 326/36 |
| 6,492,842 B1 * | 12/2002 | Gendai | ........................ 326/126 |

* cited by examiner

*Primary Examiner*—Don Le
(74) *Attorney, Agent, or Firm*—Eric Froehlich

(57) ABSTRACT

A novel majority logic circuit is disclosed to determine whether the majority of the inputs are a one, within a constant number of clock cycles, regardless of the number of inputs. The majority logic circuit according to the present invention includes a plurality of current mirror stages and an amplifier stage. For each input, one current mirror stage is used, which outputs either a current source if the input is a one, or a current sink if the input is a zero. The current sources of all the input current mirror stages are connected in parallel to the current source input node of the amplifier stage. The current sinks of all the input current mirror stages are connected in parallel to the current sink input node of the amplifier stage. The amplifier is a differential type, which outputs either a positive voltage or a zero voltage depending upon the majority of the inputs.

2 Claims, 3 Drawing Sheets

MAJORITY LOGIC CIRCUIT

FIELD OF THE INVENTION

The present invention relates, in general, to electronic digital logic circuitry, and, in particular to determining the value of a majority of the inputs.

BACKGROUND OF THE INVENTION

A majority logic circuit indicates whether a majority of binary inputs are equal to one. Prior art techniques accomplish this by either counting the number of inputs, or by using Boolean logic. Typically, an odd number of inputs are used to eliminate the possibility of having an equal number of ones and zeros.

U.S. Pat. No. 4,091,293, entitled "MAJORITY DECISION LOGIC CIRCUIT," discloses a method of detecting buffer overflow exploits by searching for pointer fingerprints. A pointer fingerprint is a portion of a pointer containing at least a portion of the return address. Preferably, the method searches for the return address of a jump function only in portions of the stack where jump functions are not expected. This method requires extensive use of processor resources and requires a determination of which return addresses are valid and which are invalid. U.S. Pat. No. 4,091,293 is hereby incorporated by reference into the specification of the present invention.

U.S. Pat. No. 4,692,640, entitled "MAJORITY CIRCUIT COMPRISING BINARY COUNTER," discloses a circuit comprising a series of binary counters. Each counter is initially set to zero, with data entered serially over multiple clock cycles. If the input data is a one, the binary counter is incremented. After all data has been entered, if the output is greater than the number of inputs divided by two, the circuit indicates that the majority of the inputs were a one. The time to determine the output increases with each additional input. The present invention is not limited in this regard. U.S. Pat. No. 4,692,640 is hereby incorporated by reference into the specification of the present invention.

U.S. Pat. No. 5,680,408, entitled "METHOD AND APPARATUS FOR DETERMINING A VALUE OF A MAJORITY OF OPERANDS," discloses a circuit that can determine the output in a short number of clock cycles. Multiple operands are received, and only the minimum number of inputs is tested to insure that the majority of the inputs are equal to one. The invention works well for small number of inputs, but does not scale well for large numbers of inputs, and becomes very complex. The present invention is not limited in this regard. U.S. Pat. No. 5,680,408 is hereby incorporated by reference into the specification of the present invention.

SUMMARY OF THE INVENTION

It is an object of the present invention to provide a majority logic circuit to determine the binary state of a plurality of inputs in a constant number of clock cycles.

The majority logic circuit determines whether the majority of the inputs are a one, within a constant number of clock cycles, regardless of the number of inputs.

The majority logic circuit according to the present invention includes a plurality of current mirror stages and an amplifier stage. For each input, one current mirror stage is used, which outputs either a current source if the input is a one, or a current sink if the input is a zero.

The current sources of all the input current mirror stages are connected in parallel to the current source input node of the amplifier stage. The current sinks of all the input current mirror stages are connected in parallel to the current sink input node of the amplifier stage. The source input to the amplifier stage will be the equal to the combined source current from all the input current mirror stages divided by the number of inputs. Likewise, the sink input to the amplifier stage will be the equal to the combined sink current from all the input current mirror stages divided by the number of inputs.

The amplifier is a differential type, which outputs either a positive voltage or a zero voltage depending upon the majority of the inputs.

DETAILED DESCRIPTION

The present invention comprises a novel majority logic circuit to provide an indication of the binary state of the majority of the inputs. The output of the present invention is provided in the same number of clock cycles, regardless of the number of inputs.

Figure 1:
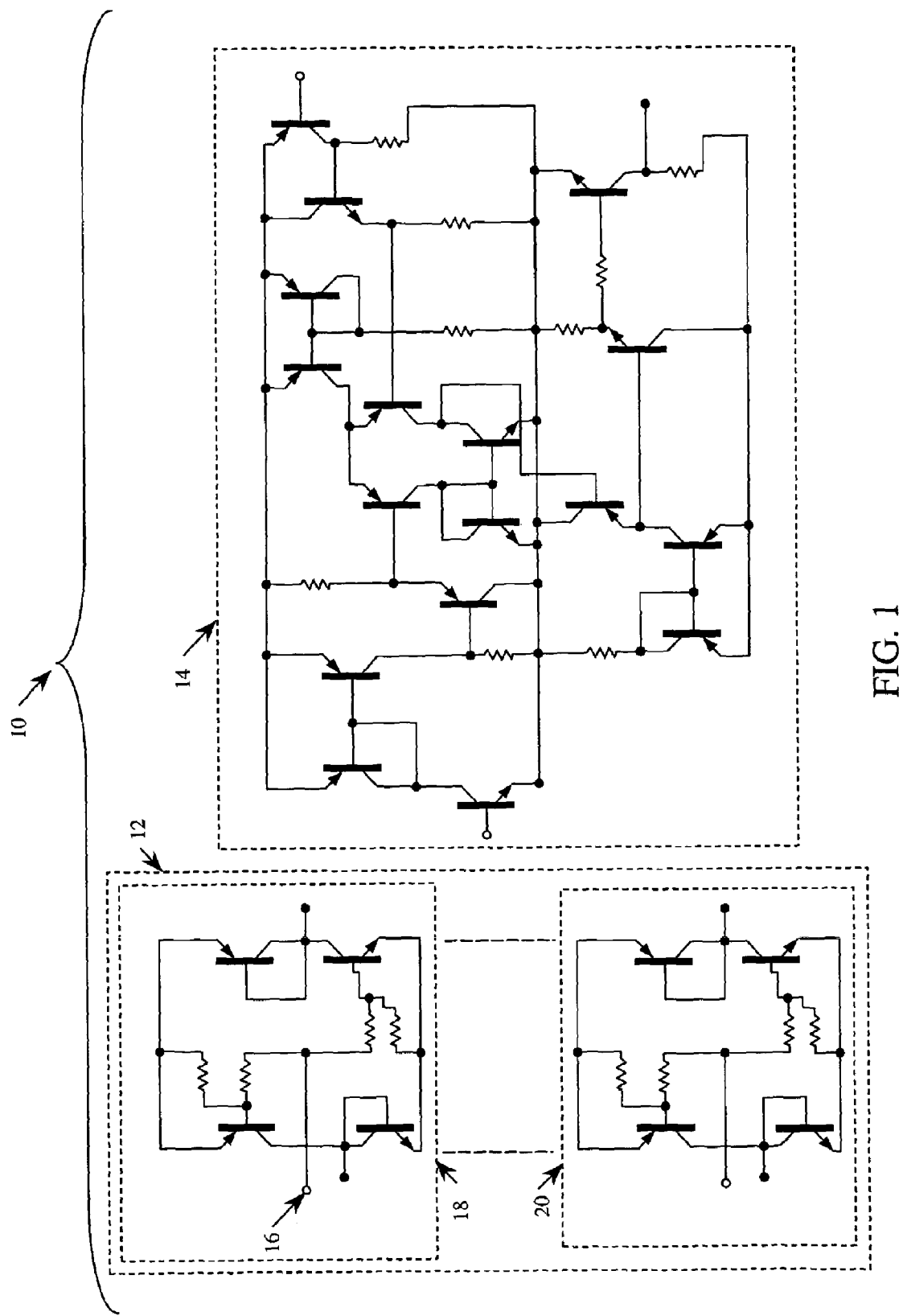
FIG. 1 is a circuit diagram of the present invention.

Referring to FIG. 1, a majority logic circuit 10 according to the present invention is shown. The majority logic circuit 10 has a plurality of current mirrors 12, and an amplifier 14. The number of the plurality of current mirrors 12 equals the number of inputs 16 to the majority logic circuit 10. In the preferred embodiment, the majority logic circuit 10 has an odd number of inputs 16. Only the first current mirror 18 and the Nth current mirror 20 are shown.

The majority logic circuit 10 employs a number of bipolar transistors, either of the NPN type or the PNP type. Each transistor has an emitter, a base, and a collector.

Each of the plurality of current mirrors 12 is identical, and only the first current mirror 18 will be described.

Figure 2:
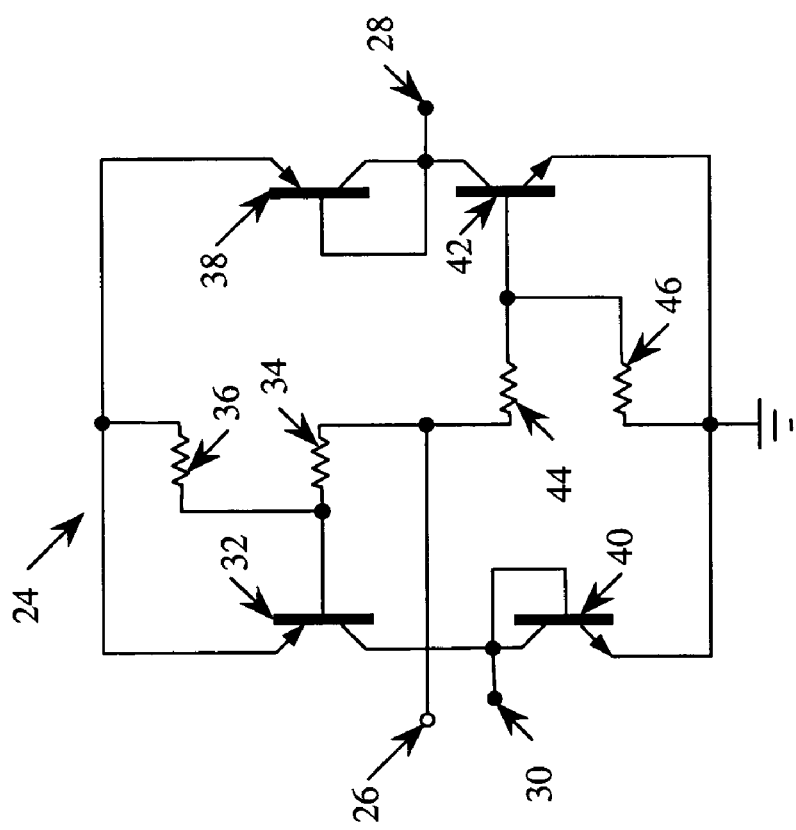
FIG. 2 is a circuit diagram of the current mirror portion of the circuit shown in FIG. 1.

Referring to FIG. 2, the first current mirror 24 has an input node 26, a sink node 28, and a source node 30. The first current mirror 24 has a first PNP transistor 32, having an emitter, a base, and a collector. A current connection path connects the collector of the first PNP transistor 30 to the source node 30.

A first resistor 34 has a first terminal and a second terminal. The first terminal of the first resistor 34 is connected to the input node 26 by a current connection path. The second terminal is connected to the base of the first PNP transistor 32 by a current connection path.

A second resistor 36 has a first terminal and a second terminal. The first terminal of the second resistor 36 is connected to the base of the first PNP transistor 32 by a current connection path. The second terminal is connected to the emitter of the first PNP transistor 32 by a current connection path.

A current connection path connects the emitter of the second PNP transistor 38 to the emitter of the first PNP transistor 32. The base of the second PNP transistor 38 is connected to the collector of the second PNP transistor 38 by a current connection path, and the collector is connected to the sink node 28, also by a current connection path.

A current connection path connects the base of the third NPN transistor 40 to the collector of the third NPN transistor 40. The collector is connected by a current connection path to the collector of the first PNP transistor 32.

A current connection path connects the emitter of the fourth NPN transistor 42 to the emitter of the third NPN transistor 40. A current connection path connects the collector to the collector of the second PNP transistor 38.

A third resistor 44 has a first terminal and a second terminal. The first terminal of the third resistor 44 is connected to the first terminal of the first resistor 34 by a current connection path. The second terminal is connected to the base of the fourth NPN transistor 42 by a current connection path.

A fourth resistor 46 has a first terminal and a second terminal. The first terminal of the fourth resistor 46 is connected to the base of the fourth NPN transistor 42 by a current connection path. The second terminal is connected to the emitter of the third NPN transistor 40 by a current connection path.

In the preferred embodiment, the emitter of the third NPN transistor 40 is connected to ground, and the emitter of the first PNP transistor 32 is connected to a positive supply voltage. Those persons skilled in the art will recognize that a positive supply voltage of five volts is preferred.

When the first input is applied to the input node 26, the first resistor 34 and the second resistor 36 acts as a voltage divider. If the first input is a one (five volts), the first PNP transistor 32 will be actively biased, sourcing current to the third NPN transistor 40, and to the source node 30.

The first input is also applied through the input node 26 to the voltage divider formed from the third resistor 44 and the fourth resistor 46. If the input is zero, the fourth NPN transistor 42 will be actively biased, sinking current from the second PNP transistor 38.

Referring to FIG. 1, each current mirror from the first 18 to the Nth 20 will produce a current source if the respective input is a one, and a current sink if the respective input is a zero. Referring again to FIG. 2, the source node 30 of the first current mirror 24 and all the remaining source nodes from the second through Nth current mirrors (not shown) are connected in parallel to the source input node 50 of the amplifier 52 shown in FIG. 3. Referring again to FIG. 2, the sink node 28 of the first current mirror 24 and all the remaining source nodes from the second through Nth current mirrors (not shown) are connected in parallel to the sink input node 54 of the amplifier 52 shown in FIG. 3.

Because all of the source nodes from all of the current mirrors are connected in parallel to the source input node 50, the current generated will be equal to the combined input currents divided by the total number of inputs. Likewise, because all of the sink nodes from all of the current mirrors are connected in parallel to the sink input node 54, the current generated will be equal to the combined input currents divided by the total number of inputs.

Figure 3:
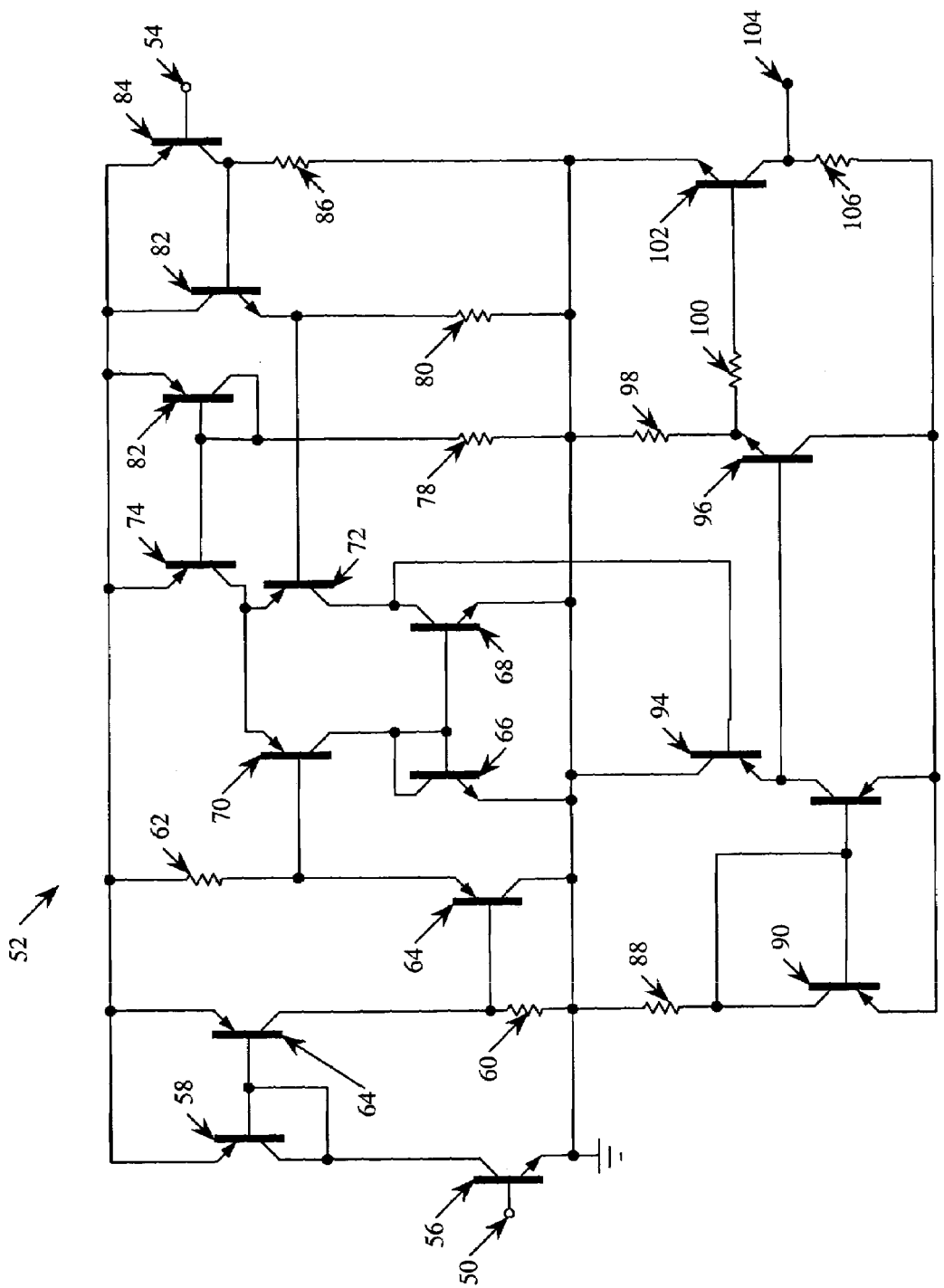
FIG. 3 is a circuit diagram of the amplifier portion of the circuit shown in FIG. 1.

As shown in FIG. 3, the source input node 50 is connected to the base of a fifth NPN transistor 56 by a current connection path.

A current connection path connects the base of the sixth PNP transistor 58 to the collector of the sixth PNP transistor 58. The collector is connected to the collector of the fifth NPN transistor 56, also by a current connection path.

A fifth resistor 60 has a first terminal and a second terminal. The first terminal of the fifth resistor 60 is connected to the emitter of the fifth NPN transistor 56 by a current connection path.

A sixth resistor 62 has a first terminal and a second terminal. The first terminal of the sixth resistor 62 is connected to the emitter of the sixth PNP transistor 58 by a current connection path.

A seventh PNP transistor 64 has an emitter, a base, and a collector. A current connection path connects the emitter of the seventh PNP transistor 64 to the emitter of the sixth PNP transistor 58. The base of the seventh PNP transistor 64 is connected to the base of the sixth PNP transistor 58 by a current connection path, and the collector is connected to the second terminal of the fifth resistor 60 by a current connection path.

The sixth PNP transistor 58 and the seventh PNP transistor 60 form a current mirror, which generates a control voltage in fifth resistor 60.

A current connection path connects the emitter of the eighth PNP transistor 64 to the second terminal of the sixth resistor 62. The base of the seventh PNP transistor 64 is connected to the second terminal of the fifth resistor 60 by a current connection path, and the collector is connected to the emitter of the fifth NPN transistor 56 by a current connection path.

A current connection path connects the emitter of the ninth NPN transistor 66 to the emitter of the fifth NPN transistor 56. The base of the ninth NPN transistor 66 is connected to the collector of the ninth NPN transistor 66 by a current connection path.

A current connection path connects the emitter of the tenth NPN transistor 66 to the emitter of the fifth NPN transistor 56. The base of the ninth NPN transistor 66 is connected to the base of the ninth NPN transistor 66 by a current connection path.

A current connection path connects the base of the eleventh PNP transistor 70 to the emitter of the eighth PNP transistor 64. The collector of the eleventh PNP transistor 70 is connected to the collector of the ninth NPN transistor 66 by a current connection path.

A current connection path connects the emitter of the twelfth PNP transistor 72 to the emitter of the eleventh PNP transistor 70, and a current connection path connects the collector of the twelfth PNP transistor 72 to the collector of the tenth NPN transistor 68.

A current connection path connects the emitter of the thirteenth PNP transistor 74 to the emitter of the sixth PNP transistor 58, and a current connection path connects the collector of the thirteenth PNP transistor 74 to the emitter of the eleventh PNP transistor 70.

A current connection path connects the emitter of the fourteenth PNP transistor 76 to the emitter of the sixth PNP transistor 58. The base of the fourteenth PNP transistor 76 is connected to the base of the thirteenth PNP 74 transistor by a current connection path, and the collector is connected to the base of the thirteenth PNP transistor 74 by a current connection path.

A seventh resistor 78 has a first terminal and a second terminal. The first terminal of the seventh resistor 78 is connected to the emitter of the fifth NPN transistor 56 by a current connection path, and the second terminal is connected to the base of the thirteenth PNP transistor 74 by a current connection path.

An eighth resistor 80 has a first terminal and a second terminal. The first terminal of the seventh resistor 78 is connected to the emitter of the fifth NPN transistor 56 by a current connection path, and the second terminal is connected to the base of the twelfth PNP transistor 72 by a current connection path.

A current connection path connects the emitter of the fifteenth NPN transistor 82 to the base of the twelfth PNP transistor 72, and the collector of the fifteenth NPN transistor 82 is connected to the emitter of the sixth PNP transistor 58 by a current connection path.

A current connection path connects the emitter of the sixteenth PNP transistor 84 to the emitter of the sixth PNP transistor 58, the base of the sixteenth PNP transistor 84 is connected to the sink input node 54 by a current connection path, and the collector of the sixteenth PNP transistor 84 is connected to the base of the fifteenth NPN transistor 82 by a current connection path.

A ninth resistor 86 has a first terminal and a second terminal. The first terminal of the ninth resistor 86 is connected to the emitter of the fifth NPN transistor 56 by a current connection path, and the second terminal is connected to the base of the fifteenth NPN transistor 82 by a current connection path.

A tenth resistor 88 has a first terminal and a second terminal. The first terminal of the tenth resistor 88 is connected to the emitter of the fifth NPN transistor 56 by a current connection path.

A current connection path connects the base of the seventeenth PNP transistor 90 to the collector of the seventeenth PNP transistor 90. The collector of the seventeenth PNP transistor 90 is connected to the second terminal of the tenth resistor 88 by a current connection path.

A current connection path connects the emitter of the eighteenth PNP transistor 92 to the emitter of the seventeenth PNP transistor 90, and a current connection path connects the base of the eighteenth PNP transistor 92 to the base of the seventeenth PNP transistor 90.

A current connection path connects the emitter of the nineteenth PNP transistor 94 to the collector of the eighteenth PNP transistor 92. The base of the nineteenth PNP transistor 94 is connected by a current connection path to the collector of the tenth PNP transistor 72, and the collector of the nineteenth PNP transistor 94 is connected to the emitter of the fifth NPN transistor 56 by a current connection path.

A current connection path connects the base of the twentieth NPN transistor 96 to the collector of the eighteenth PNP transistor 92, and the collector of the twentieth NPN transistor 96 is connected to the emitter of the seventeenth PNP transistor 90 by a current connection path.

An eleventh resistor 98 has a first terminal and a second terminal. The first terminal of the eleventh resistor 98 is connected to the emitter of the fifth NPN transistor 56 by a current connection path, and the second terminal is connected to the emitter of the twentieth NPN transistor 96 by a current connection path.

A twelfth resistor 100 has a first terminal and a second terminal. The first terminal of the twelfth resistor 100 is connected to the emitter of the twentieth NPN transistor 96 by a current connection path.

A current connection path connects the emitter of the twenty-first NPN transistor 102 to the emitter of the fifth NPN transistor 56. The base of the twenty-first NPN transistor is connected to the second terminal of the twelfth resistor 100 by a current connection path, and the collector of the twenty-first NPN transistor 102 is connected to the output node 104 by a current connection path.

A thirteenth resistor 106 has a first terminal and a second terminal. The first terminal of the thirteenth resistor 106 is connected to the emitter of the seventeenth PNP transistor 90 by a current connection path, and the second terminal is connected by a current connection path to the collector of the twenty-first NPN transistor 102.

In the preferred embodiment, the emitter of the fifth NPN transistor 56 is connected to ground, and the emitter of the sixth PNP transistor 58, and the emitter of the seventeenth PNP transistor 90 are connected to a positive supply voltage. Those persons skilled in the art will recognize that a positive supply voltage of five volts is preferred.

While the preferred embodiments of the invention have been illustrated and described, it will be apparent to those of ordinary skill in the art that various changes and modifications may be made without deviating from the inventive concepts set forth above.

What is claimed is:

1. A majority logic circuit comprising:
 a) a plurality of current mirrors, said plurality of current mirrors having an input node, a sink node and a source node, each of said plurality of current mirrors further comprising
   i) a first PNP transistor, said first PNP transistor having an emitter, a base, and a collector, the collector connected by a current connection path to the source node;
   ii) a first resistor, said first resistor having a first and a second terminal, the first terminal connected by a current connection path to the input node, and the second terminal connected by a current connection path to the base of the first transistor;
   iii) a second resistor, said first resistor having a first and a second terminal, the first terminal connected by a current connection path to the base of the first PNP transistor, and the second terminal connected by a current connection path to the emitter of the first PNP transistor;
   iv) a second PNP transistor, said second PNP transistor having an emitter, a base, and a collector, the emitter connected by a current connection path to emitter of the first PNP transistor, the base connected by a current connection path to the collector of the second PNP transistor, and the collector connected by a current connection path to the sink node;
   v) a third NPN transistor, said third NPN transistor having an emitter, a base, and a collector, the base connected by a current connection path to the collector of the third NPN transistor, and the collector connected by a current connection path to the collector of the first PNP transistor;
   vi) a fourth NPN transistor, said fourth NPN transistor having an emitter, a base, and a collector, the emitter connected by a current connection path to the emitter of the third NPN transistor, and the collector connected by a current connection path to the collector of the second PNP transistor;
   vii) a third resistor, said third resistor having a first and a second terminal, the first terminal connected by a current connection path to the first terminal of the first resistor, and the second terminal connected by a current connection path to the base of the fourth NPN transistor; and
   viii) a fourth resistor, said fourth resistor having a first and a second terminal, the first terminal connected by a current connection path to the base of the fourth NPN transistor, and the second terminal connected by a current connection path to the emitter of the third NPN transistor;
 b) an amplifier, said amplifier having a source input node connected by a current connection path to the plurality of source nodes of the plurality of current mirrors, a sink input node connected by a current connection path to the plurality of sink nodes of the plurality of current mirrors, and an output node, the amplifier further comprising i) a fifth NPN transistor, said fifth transistor having an emitter, a base, and a collector, the base connected by a current connection path to the source input node;

ii) a sixth PNP transistor, said sixth PNP transistor having an emitter, a base, and a collector, the base connected by a current connection path to the collector of the sixth PNP transistor, and the collector connected by a current connection path to the collector of the fifth NPN transistor;

iii) a fifth resistor, said fifth resistor having a first and a second terminal, the first terminal connected by a current connection path to the emitter of the fifth NPN transistor;

iv) a sixth resistor, said sixth resistor having a first and a second terminal, the first terminal connected by a current connection path to the emitter of the sixth PNP transistor;

v) a seventh PNP transistor, said seventh PNP transistor having an emitter, a base, and a collector, the emitter connected by a current connection path to the emitter of the sixth PNP transistor, the base connected by a current connection path to the base of the sixth PNP transistor, and the collector connected by a current connection path to the second terminal of the fifth resistor;

vi) a eighth PNP transistor, said eighth PNP transistor having an emitter, a base, and a collector, the emitter connected by a current connection path to the second terminal of the sixth resistor, the base connected by a current connection path to the second terminal of the fifth resistor, and the collector connected by a current connection path to the emitter of the fifth NPN transistor;

vii) a ninth NPN transistor, said ninth NPN transistor having an emitter, a base, and a collector, the emitter connected by a current connection path to the emitter of the fifth NPN transistor, and the base connected by a current connection path to the collector of the ninth NPN transistor;

viii) a tenth NPN transistor, said tenth NPN transistor having an emitter, a base, and a collector, the emitter connected by a current connection path to the emitter of the fifth NPN transistor, and the base connected by a current connection path to the base of the ninth NPN transistor;

ix) an eleventh PNP transistor, said eleventh PNP transistor having an emitter, a base, and a collector, the base connected by a current connection path to the emitter of the eighth PNP transistor, and the collector connected by a current connection path to the collector of the ninth NPN transistor;

x) an twelfth PNP transistor, said twelfth PNP transistor having an emitter, a base, and a collector, the emitter connected by a current connection path to the emitter of the eleventh PNP transistor, and the collector connected by a current connection path to the collector of the tenth NPN transistor;

xi) a thirteenth PNP transistor, said thirteenth PNP transistor having an emitter, a base, and a collector, the emitter connected by a current connection path to the emitter of the sixth PNP transistor, and the collector connected by a current connection path to the emitter of the eleventh PNP transistor;

xii) a fourteenth PNP transistor, said fourteenth PNP transistor having an emitter, a base, and a collector, the emitter connected by a current connection path to the emitter of the sixth PNP transistor, the base connected by a current connection path to the base of the thirteenth PNP transistor, and the collector connected by a current connection path to the base of the thirteenth PNP transistor;

xiii) a seventh resistor, said seventh resistor having a first and a second terminal, the first terminal connected by a current connection path to the emitter of the fifth NPN transistor, and the second terminal connected by a current connection path to the base of the thirteenth PNP transistor;

xiv) an eighth resistor, said eighth resistor having a first and a second terminal, the first terminal connected by a current connection path to the emitter of the fifth NPN transistor, and the second terminal connected by a current connection path to the base of the twelfth PNP transistor;

xv) a fifteenth NPN transistor, said fifteenth NPN transistor having an emitter, a base, and a collector, the emitter connected by a current connection path to the base of the twelfth PNP transistor, and the collector connected by a current connection path to the emitter of the sixth PNP transistor;

xvi) a sixteenth PNP transistor, said sixteenth PNP transistor having an emitter, a base, and a collector, the emitter connected by a current connection path to the emitter of the sixth PNP transistor, the base connected by a current connection path to the sink input node, and the collector connected by a current connection path to the base of the fifteenth NPN transistor;

xvii) an ninth resistor, said ninth resistor having a first and a second terminal, the first terminal connected by a current connection path to the emitter of the fifth NPN transistor, and the second terminal connected by a current connection path to the base of the fifteenth NPN transistor;

xviii) an tenth resistor, said tenth resistor having a first and a second terminal, the first terminal connected by a current connection path to the emitter of the fifth NPN transistor;

xix) a seventeenth PNP transistor, said seventeenth PNP transistor having an emitter, a base, and a collector, the base connected by a current connection path to the collector of the seventeenth PNP transistor, and the collector connected by a current connection path to the second terminal of the tenth resistor;

xx) a eighteenth PNP transistor, said eighteenth PNP transistor having an emitter, a base, and a collector, the emitter connected by a current connection path to the emitter of the seventeenth PNP transistor, and the base connected by a current connection path to the base of the seventeenth PNP transistor;

xxi) a nineteenth PNP transistor, said nineteenth PNP transistor having an emitter, a base, and a collector, the emitter connected by a current connection path to the collector of the eighteenth PNP transistor, the base connected by a current connection path to the collector of the tenth NPN transistor, and the collector connected by a current connection path to the xxii) emitter of the fifth NPN transistor;

xxiii) a twentieth NPN transistor, said twentieth NPN transistor having an emitter, a base, and a collector, the base connected by a current connection path to the collector of the eighteenth PNP transistor, and the collector connected by a current connection path to the emitter of the seventeenth PNP transistor;

xxiv) an eleventh resistor, said eleventh resistor having a first and a second terminal, the first terminal connected by a current connection path to the emitter of the fifth NPN transistor, and the second terminal connected by a current connection path to the emitter of the twentieth NPN transistor;

xxv) a twelfth resistor, said twelfth resistor having a first and a second terminal, the first terminal connected by a current connection path to the emitter of the twentieth NPN transistor;

xxvi) a twenty-first NPN transistor, said twenty-first NPN transistor having an emitter, a base, and a collector, the emitter connected by a current connection path to the emitter of the fifth NPN transistor, the base connected by a current connection path to the second terminal of the twelfth resistor, and the collector connected by a current connection path to the output node; and xxvii) a thirteenth resistor, said thirteenth resistor having a first and a second terminal, the first terminal connected by a current connection path to the emitter of the seventeenth PNP transistor, and the second terminal connected by a current connection path to the collector of the twenty-first NPN transistor.

2. The device of claim 1, wherein said plurality of current mirrors is an odd number, equal to the number of inputs.

* * * * *